(12) United States Patent
Chen et al.

(10) Patent No.: US 8,797,789 B2
(45) Date of Patent: Aug. 5, 2014

(54) SENSE AMPLIFIER

(75) Inventors: Cui Li Chen, Shanghai (CN); Xiao Li Hu, Shanghai (CN); Qing Q L Li, Shanghai (CN); Rui Tu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 13/552,152

(22) Filed: Jul. 18, 2012

(65) Prior Publication Data

US 2013/0028007 A1   Jan. 31, 2013

(30) Foreign Application Priority Data

Jul. 27, 2011   (CN) .......................... 2011 1 0211607

(51) Int. Cl.
  *G11C 7/00*  (2006.01)
  *G11C 7/08*  (2006.01)
  *G11C 11/412*  (2006.01)

(52) U.S. Cl.
  CPC ................ *G11C 7/08* (2013.01); *G11C 11/412* (2013.01)
  USPC .......................................... 365/154; 365/205

(58) Field of Classification Search
  CPC ................ G11C 7/08; G11C 11/412
  USPC ................................ 365/154, 205
  See application file for complete search history.

(56) References Cited

U.S. PATENT DOCUMENTS

| 5,504,711 | A | 4/1996 | Lu et al. |
| 5,933,386 | A | 8/1999 | Walker et al. |
| 6,137,319 | A * | 10/2000 | Krishnamurthy et al. ...... 327/51 |
| 2003/0012048 | A1 | 1/2003 | Chappell et al. |
| 2004/0125678 | A1 | 7/2004 | Sinha et al. |
| 2008/0019202 | A1 | 1/2008 | Houston et al. |

FOREIGN PATENT DOCUMENTS

JP   2010218617 A1   9/2010
KR   2001075945 A1   11/2001

OTHER PUBLICATIONS

Chung et al "A Novel High-Speed Sense Amplifier for Bi-Nor Flash Memories", IEEE Journal of Solid-State Circuits, vol. 40, No. 2, Feb. 2005.

* cited by examiner

*Primary Examiner* — Michael Tran
(74) *Attorney, Agent, or Firm* — David A. Cain

(57) ABSTRACT

Embodiments of the invention provide a sense amplifier, a SRAM chip comprising the sense amplifier and a method for conducting read operation on a SRAM cell. The sense amplifier according to an embodiment of the invention comprises a cross coupling circuit, a tail current transistor and an output stage, wherein source of the tail current transistor is connected to a negative level. With the scheme according to embodiments of the invention, speed of the sense amplifier can be enhanced, thereby increasing read speed of the SRAM chip.

8 Claims, 9 Drawing Sheets

SENSE AMPLIFIER

TECHNICAL FIELD OF THE INVENTION

The invention relates to circuit technology, in particular, to sense amplifier.

BACKGROUND OF THE INVENTION

Sense amplifier is a critical component of static random access memory (SRAM). FIG. 1 is a typical configuration of sense amplifier used in SRAM. The SRAM cell in FIG. 1 is a basic element in SRAM chip for storing logic values. As shown in FIG. 1, the SRAM cell is a typical six-transistor configuration, which conducts data write and data read via two bit lines BL and BLb. The pre-charge and equalization circuit acts as assist circuit of the SRAM cell. During sensing stage, the SRAM cell outputs a pair of complementary signals on BL and BLb, that is, potential at BL is higher than BLb, or potential at BL is lower than BLb, so as to indicate whether logic value 0 or 1 is stored in the SRAM cell.

The potential difference between the complementary signals on BL and BLb is very small, generally in the range of several tens mV to one hundred mV, which is much smaller than the potential difference between logic high level and logic low level in general digital circuit. Therefore, the SRAM cell itself has limited driving capability and can not meet the requirement for driving subsequent stage logic circuits. Sense amplifier is used to process signals output on BL and BLb. The sense amplifier is generally shared by a plurality of SRAM cells whose output (that is, BL and BLb in FIG. 1) are connected to the input of the sense amplifier (that is, DLT and DLC in FIG. 1) via a bit line multiplexer circuit. The sense amplifier amplifies the two differential input signals and then outputs the two logic signals. For example, if signal level on DLT is higher than signal level on DLC, the sense amplifier will output logic high level at the output terminal OUT; and if signal level on DLT is lower than signal level on DLC, the sense amplifier will output logic low level at the output terminal OUT. A sense amplifier has stronger driving capability and thus can drive subsequent stage logic circuits.

Those skilled in the art can appreciate that, after a SRAM cell outputs signals on BL and BLb, the sense amplifier needs a certain amount of time to establish stable output. Speed of sense amplifier may be used to reflect the length of that time. The development in modern communication technology and high performance computing technology has put higher and higher requirement on speed of sense amplifier.

SUMMARY OF THE INVENTION

Embodiments of the invention provide a sense amplifier, a SRAM chip comprising the sense amplifier and a method for conducting read operation on a SRAM cell.

A sense amplifier according to an embodiment of the invention comprises a first transistor, a second transistor, a third transistor, a fourth transistor, a tail current transistor and an output stage. Gate of the second transistor and gate of the fourth transistor are connected to two inputs of the sense amplifier respectively; gate of the third transistor, drains of the first transistor and the second transistor are connected at the second node; gate of the first transistor, drains of the third transistor and the fourth transistor are connected at the first node; sources of the first transistor and the third transistor are connected to power supply level; sources of the second transistor and the fourth transistor are connected to drain of the tail current transistor; gate of the tail current transistor is connected to a sense amplifier enabling signal; source of the tail current transistor is connected to a negative level, and the first node and the second node are connected to the output stage respectively.

A SRAM chip according to an embodiment of the invention comprises the above sense amplifier.

A method according to an embodiment of the invention for conducting sensing operation on a SRAM cell comprises: connecting bit lines of the SRAM cell to an input of the sense amplifier; connecting the enabling signal to a bootstrap circuit at source of a tail current transistor of the sense amplifier; enabling the sense amplifier, so as to sense the logic value stored in the SRAM cell.

With the technical schemes according to embodiments of the invention, speed of the sense amplifier can be accelerated, thereby increasing sensing speed of the SRAM chip.

DETAILED DESCRIPTION OF THE PREFERRED EMBODIMENTS

Figure 1:
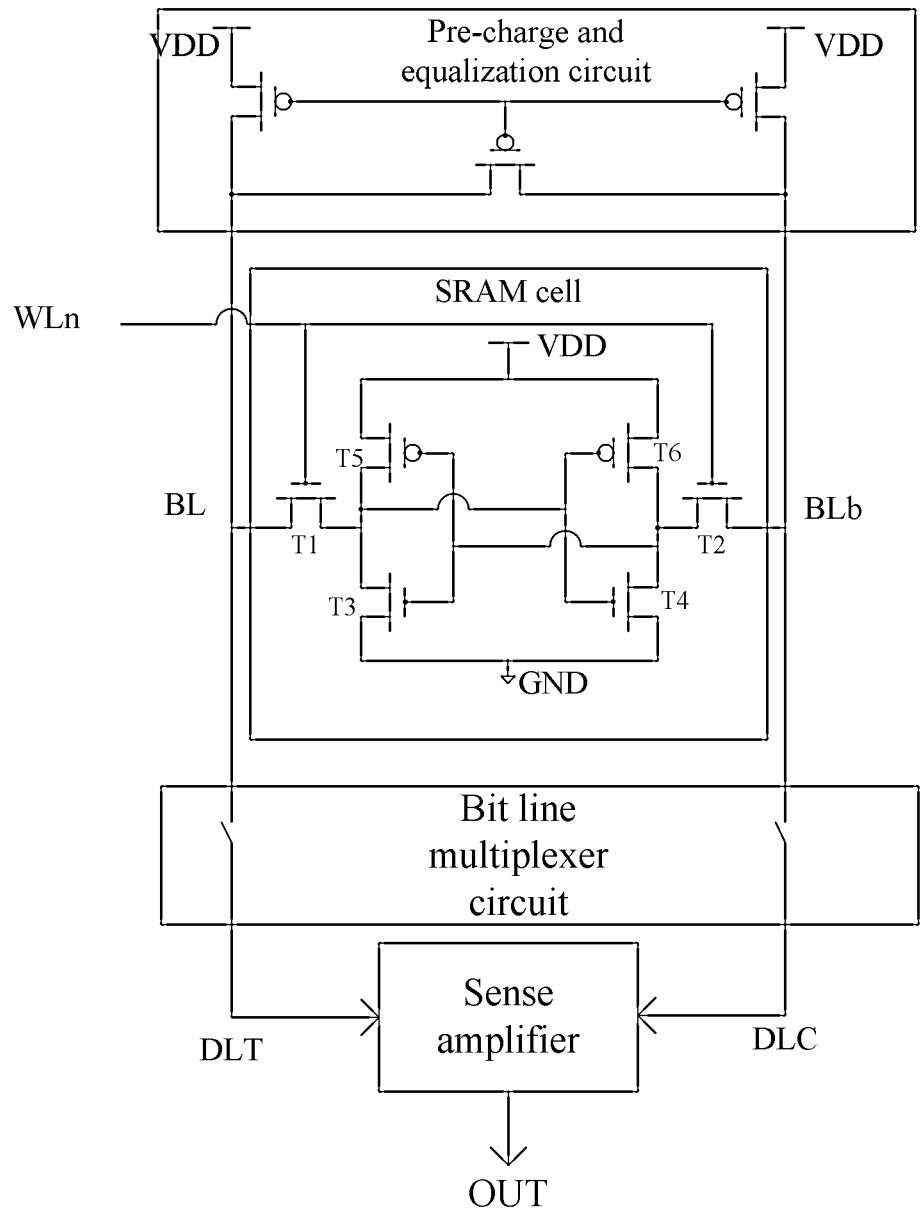
FIG. 1 is a typical circuit in which a SRAM cell cooperates with a sense amplifier.

The invention will be described below with reference to accompanying drawings of the detailed embodiments. Such description is merely for purpose of description and is not intended to limit the scope of the invention. The drawings are merely given for purpose of illustration and therefore are not drawn with scale. In addition, when a first element is described as connected to a second element, the first element not only can be directly connected to the second element, but also can be indirectly connected to the second element via a third element. Furthermore, for clarity, certain elements that are not necessary in understanding the invention are omitted. Similar and corresponding elements are represented by similar reference numbers throughout the drawing.

Those skilled in the art can appreciate that, in a digital circuit, voltage level and device type has complementary relationship. For example, turn on level of N-type transistor is high level, and turn on level of P-type transistor is low level. Therefore, conditions on high/low level involved in the following description can all be varied by changing type of relevant devices. In addition, the illustrated condition may also be changed by adding additional device(s). For example, for N-type transistor that is turned on at high level, if a NOT gate device is added between gate of the N-type transistor and input signal, then that transistor may be turned on when input signal is low level. These variations are all equivalent to embodiments of the invention described below and fall within protection scope of the invention.

Figure 2:
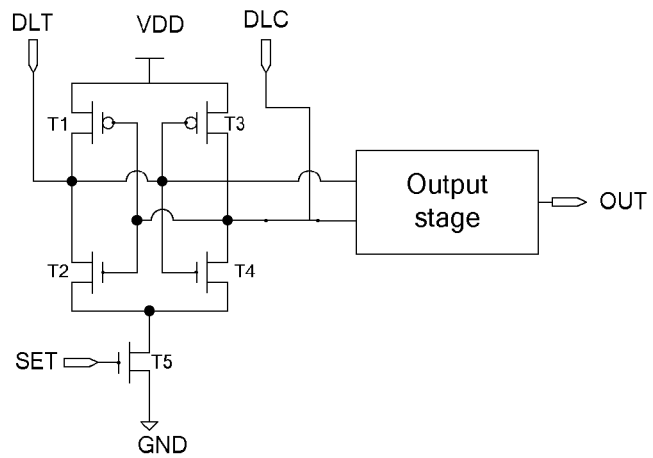
FIG. 2(A), FIG. 2(B), FIG. 2(C) and FIG. 2(D) are diagrams of a sense amplifier.
Figure 2:
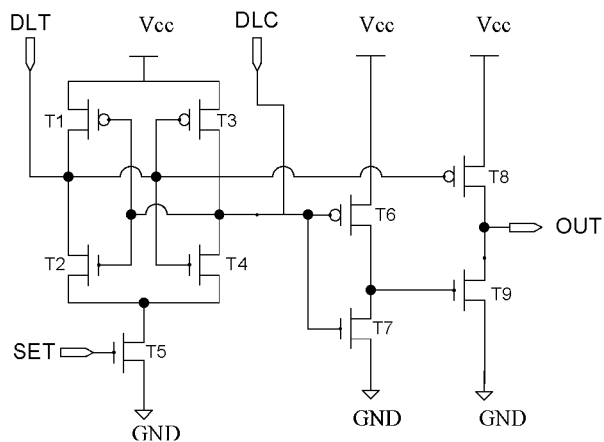
Figure 2:
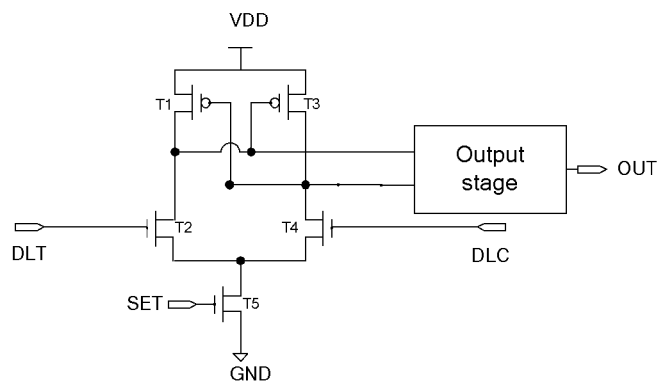
Figure 2:
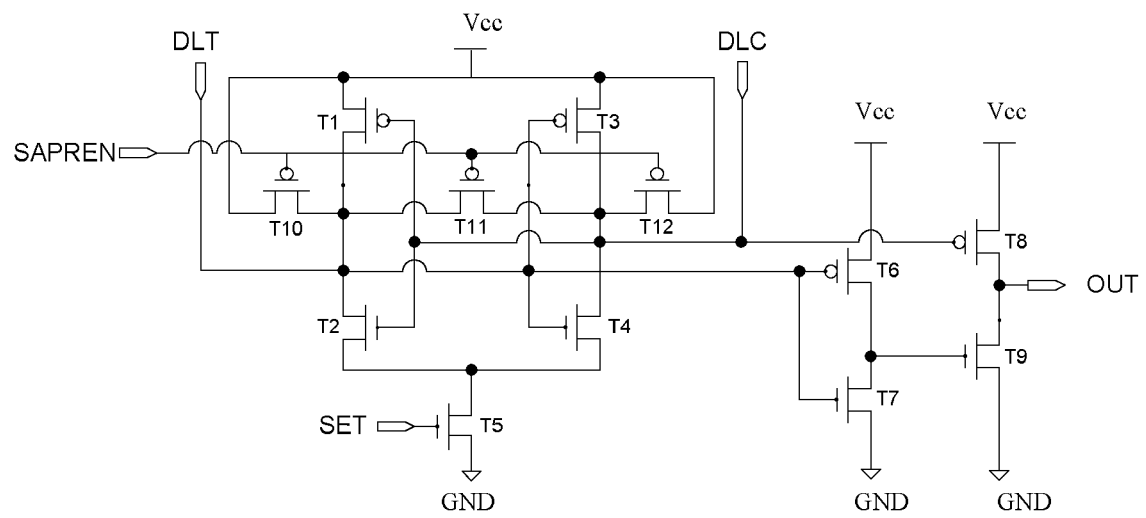

FIG. 2(A) shows a structure diagram of a sense amplifier.

In FIG. 2(A), the core part of the sense amplifier is a circuit composed of P-type transistors T1, T3 and N-type transistors T2, T4, T5, wherein, T1, T2, T3 and T4 constitute a cross coupling circuit, and T5 is referred to as tail current transistor. Gates of transistors T1 and T2 are connected at the first node, drains of transistors T1 and T2 are connected at the second node, gates of transistors T3 and T4 are connected at the second node, drains of transistors T3 and T4 are connected at the first node, sources of transistors T1 and T3 are connected to power supply level, sources of transistors T2 and T4 are connected to drain of transistor T5, the source of transistor T5 is connected to a reference level GND, gate of transistor T5 is connected to a sense amplifier enabling signal SET, the first node and the second node are connected to two inputs DLC and DLT of the sense amplifier respectively, and are further connected to output stage of the sense amplifier.

The sense amplifier shown in FIG. 2(A) comprises four terminals. Besides the previously described DLT, DLC and OUT, there is also a SET terminal. This terminal is used to enable the sense amplifier. When this terminal is at high level, the tail current transistor is turned on, forming a discharge path between T2, T4 and reference level GND. The sense amplifier begins to resolve according to input signal level and establishes an output.

Those skilled in the art may also make various changes on the sense amplifier shown in FIG. 2(A). For example, the circuit in FIG. 2(B) and FIG. 2(C) composed of transistors T6, T7, T8 and T9 connected between power supply level VDD and GND is actually a detailed implementation of output stage circuit in FIG. 2(A). This part of circuit may also be changed so as to impact the output performance of the sense amplifier. Again, for example, in FIG. 2(C), a sense amplifier pre-charge circuit composed of transistors T10, T11, T12 and corresponding terminal SAPREN is added for performing pre-charge before sense amplifier begins to operate, thereby speeding up the sense amplifier.

FIG. 2(D) is a diagram of another sense amplifier. It can be seen that, the circuit in FIG. 2(A) may be obtained by connecting gate of N-type transistor T2 in FIG. 2(D) to gate of P-type transistor T1, and connecting gate of N-type transistor T4 in FIG. 2(D) to gate of P-type transistor T2. Improvement as shown in FIG. 2(B) and FIG. 2(C) may also be performed on the circuit shown in FIG. 2(D) and description of which will be omitted here.

Figure 3:
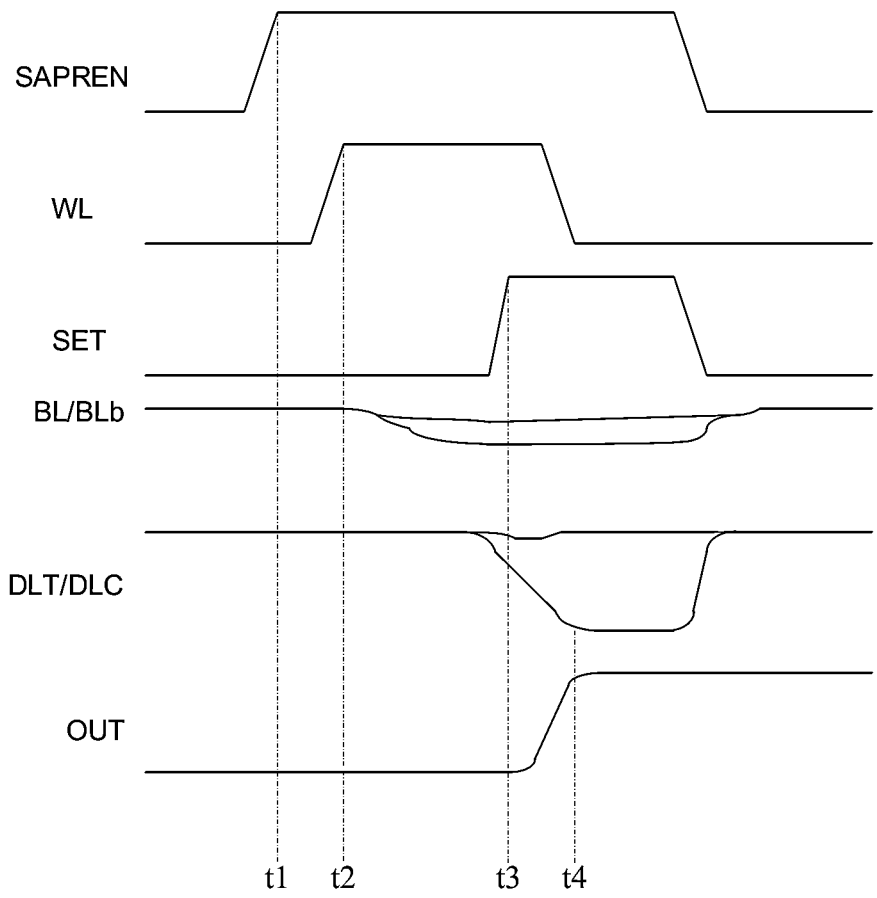
FIG. 3 is waveform of the sense amplifier shown in FIG. 2(C)

FIG. 3 is waveform of respective signals when the sense amplifier in FIG. 1 employs the structure as shown in FIG. 2(C). In the waveform shown in FIG. 3, assume that logic value stored in a SRAM cell corresponds to logic high level on the output terminal OUT of the sense amplifier. If what is stored in the SRAM cell is another logic value, then output terminal OUT of the sense amplifier retains a logic low level. At time t1, pre-charging of the sense amplifier is finished by setting logic high level on terminal SAPREN, and then the sense amplifier is ready to begin to operate. At time t2, the SRAM cell is selected via word line WL, so that it begins to output complementary signals on BL and BLb. Through the bit line multiplexer circuit connecting SRAM cell to the sense amplifier, signals on DLT and DLC are built to be equivalent to signals on BL and BLb respectively. At time t3, SET becomes high level, and the tail current transistor T5 is turned on such that a discharge path is formed, making the sense amplifier begin to operate. From this time point, potential difference on DLT and DLC increases due to formation of the discharge path, and logic level begins to be established on OUT. At time t4, the sense amplifier completes resolution. At this time point, potential difference on DLT and DLC is equivalent to potential difference between logic low level and logic high level, and a stable logic high level is outputted on OUT. It can be seen from FIG. 3 that, there is certain time interval from the time when sense amplifier begins to operate (that is, time t3) to the time when sense amplifier establishes a stable output (that is, time t4). If this time interval is shortened, then sensing performance of SRAM can be improved.

Inventor of the present invention has recognized that, time interval $\Delta t$ between t3 and t4 may be calculated approximately according to the following formula:

$$\Delta t = \tau_1 \times \ln\left(\frac{VDD}{V_{margin}}\right),$$

wherein VDD is power supply level of the circuit, $V_{margin}$ is potential difference on DLT and DLC when tail current transistor T5 is turned on (that is, time t3). Further, there exists the following relationship:

$$\tau_1 \approx \frac{C}{G_m},$$

wherein C is capacitive load of the sense amplifier. $G_m = g_{mn} + g_{mp}$, wherein $g_{mn}$ is transconductance of N-type transistor T2; since T2 and T4 are set symmetrically, $g_{mn}$ is also transconductance of T4; $g_{mp}$ is transconductance of P-type transistor T1; since T1 and T3 are set symmetrically, $g_{mn}$ is also transconductance of T6.

$$g_{mn} = \sqrt{\mu_n \times C_{ox} \times \frac{W_n}{L_n} \times I_D},$$

$$g_{mp} = \sqrt{\mu_p \times C_{ox} \times \frac{W_p}{L_p} \times I_D},$$

wherein $\mu$ is carrier mobility of transistor, $C_{ox}$ is gate capacitance of transistor, W and L are channel width and channel length of transistor respectively, and $I_D$ is turn-on current through the tail current transistor T5. It can be seen from the above relationship that, if $I_D$ is increased, then $g_{mn}$ and $g_{mp}$ will be increased, so that $G_m$ is increased, and in turn, $\tau_1$ is decreased, such that $\Delta t$ is reduced. In short, speed of sense amplifier may be increased by increasing $I_D$.

Figure 4:
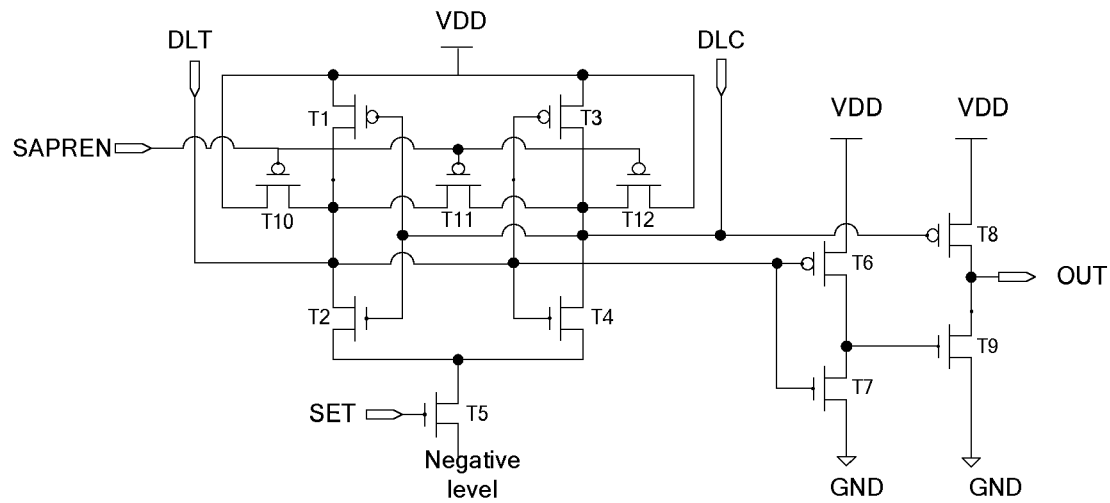
FIG. 4 is a diagram of a sense amplifier.

On basis of this, the sense amplifier according to an embodiment of the invention is shown in FIG. 4. FIG. 4 is formed by making improvement on basis of the sense amplifier shown in FIG. 2(C), and those skilled in the art may also employ sense amplifier with other configuration forms. As shown in FIG. 4, the source of the tail current transistor T5 of the sense amplifier is connected to a negative level rather than being connected to the reference level GND. Thus, when SET becomes high and the tail current transistor T5 is turned on, since T5 is connected between negative level at source and positive level at gate now, the current passing through T5 is larger than the current passing through T5 when the source of T5 is connected to reference level GND, such that time interval $\Delta t$ between t3 and t4 is reduced.

Figure 5:
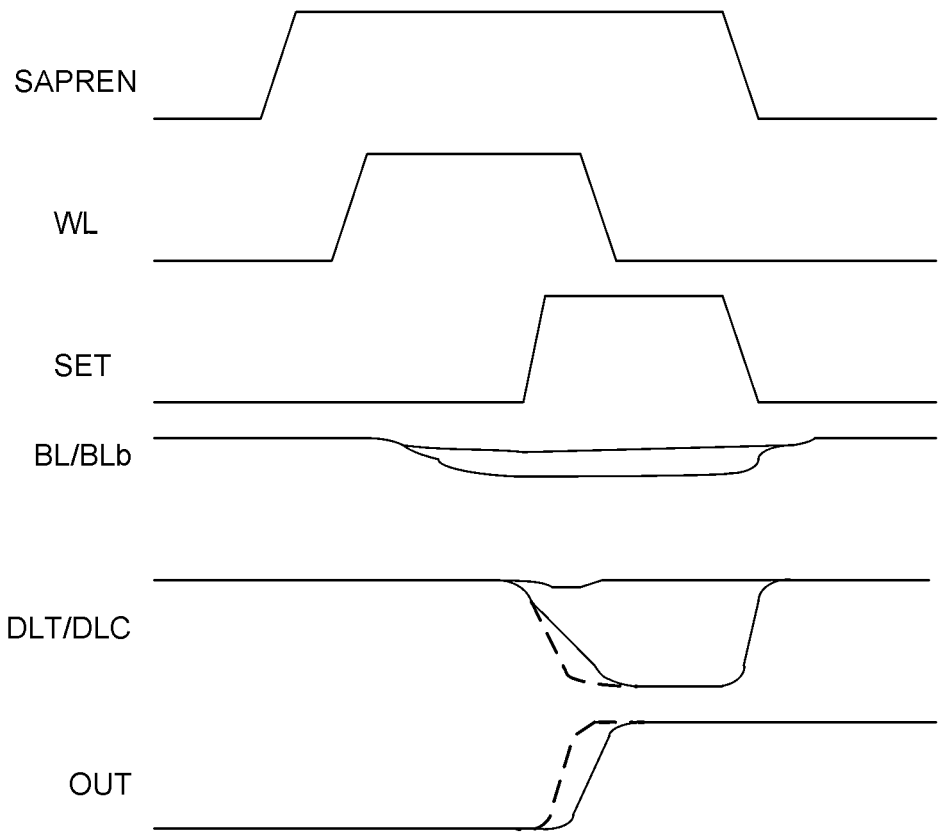
FIG. 5 is waveform of the sense amplifier shown in FIG. 4.

FIG. 5 shows performance improvement when the sense amplifier in FIG. 1 employs the structure as shown in FIG. 4. As shown in FIG. 5, in case that other conditions remain unchanged, the waveform as shown by dotted line may be obtained by using the sense amplifier according to an embodiment of the invention, wherein potential difference of signals on DLT and DLC is more quickly enlarged to potential difference between logic high level and logic low level, and signal on OUT changes more quickly from logic low level to logic high level.

In order to supply a negative level to the source of tail current transistor T5 as shown in FIG. 4, multiple implementations may be utilized. For example, a negative voltage supply source may be set at power supply portion of the circuit. Those skilled in the art can appreciate that, the negative voltage supply source is relative to the reference level, and therefore, any negative voltage supply source may be used as long as its potential is lower than the reference level.

Figure 6:
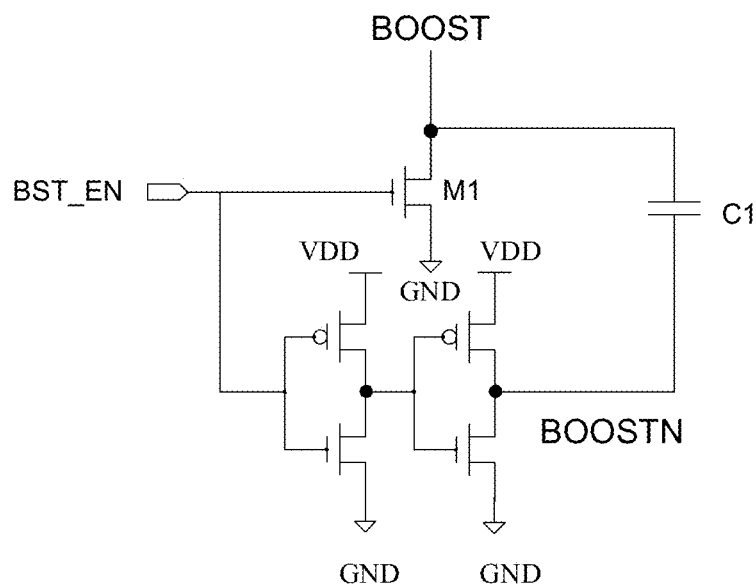
FIG. 6 is a diagram of a bootstrap circuit.

Alternatively, the negative level may be dynamically generated by using a bootstrap circuit. One implementation of the bootstrap circuit according to an embodiment of the invention is shown in FIG. 6. In FIG. 6, BST_EN is a bootstrap circuit enabling signal which is valid at logic low level; BOOST node is negative voltage output node of the bootstrap circuit, which is connected to the source of the tail current transistor. When the sense amplifier is not operating, BST_EN is at high level, transistor M1 is turned on, and the tail current transistor is connected to reference level GND via M1; BOOSTN node is at power supply level VDD so that capacitor C1 is charged. After the bootstrap circuit is enabled, transistor M1 is turned off, and BOOSTN node is connected to reference level GND; the coupling of capacitor C1 generates a negative level on BOOSTN node, and this negative level will be kept for a period of time. After that, the BST_EN signal is changed from logic low level to logic high level at appropriate time to reset the bootstrap circuit, so as to get ready to generate negative level at next cycle. Those skilled in the art may also implement other bootstrap circuit, as long as it can generate a negative level at the node connected to the source of the tail current transistor.

Figure 7:
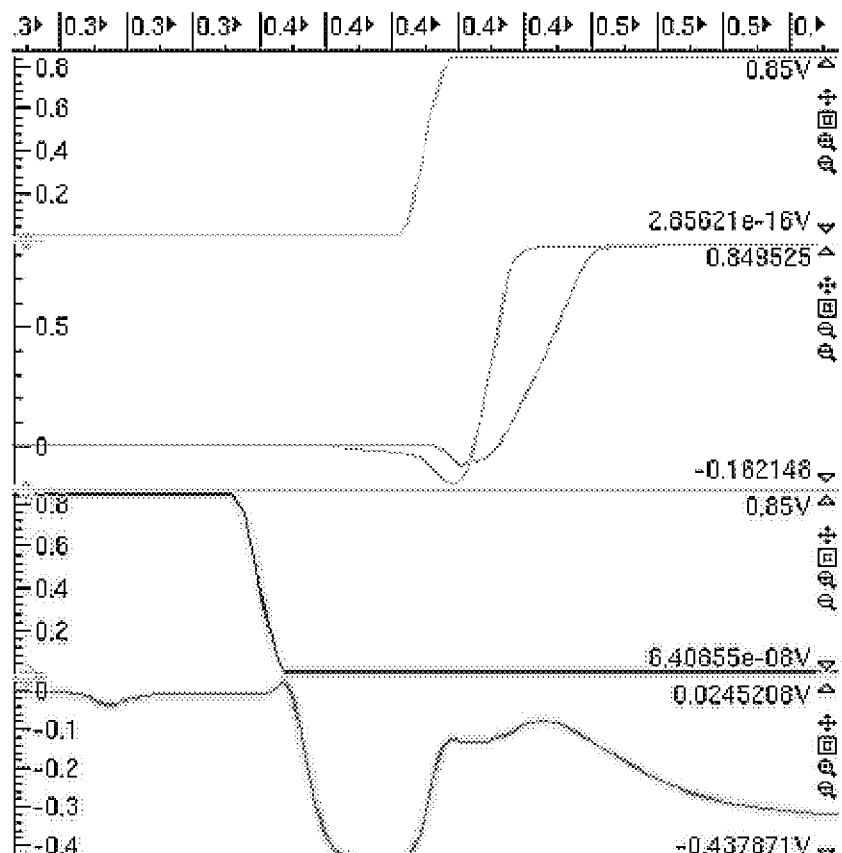
FIG. 7 is waveform showing performance improvement in sense amplifier.

FIG. 7 shows performance improvement brought by implementing the negative level of sense amplifier shown in FIG. 4 with the bootstrap circuit as shown in FIG. 6. In FIG. 7, waveform at the first line corresponds to SET, that is, sense amplifier enabling signal. There are two curves in waveform at the second line, corresponding to signals on output (OUT) of the sense amplifier when the source of T5 is connected to reference level GND and when the source of T5 is connected to negative level BOOST respectively, wherein the former corresponds to the curve with slow rising slew (that is, with small slope), and the latter corresponds to the curve with fast rising slew (that is, with large slope). The waveform at the third line corresponds to bootstrap circuit enabling signal, that is, BST_EN. The waveform at the fourth line corresponds to the signal on BOOST node.

It can be seen from FIG. 7 that, in actual operation, the bootstrap circuit is firstly enabled, so the bootstrap circuit generates a negative level at BOOST node; then SET is changed to logic high level, so that the tail current transistor T5 is turned on. The time at which SET is changed to logic high level must be in a period during which negative level exists on BOOST node. It can also be seen from FIG. 7 that, after the tail current transistor is turned on, the negative level generated on BOOST tends to approach the reference level. This is because, due to formation of the conductive path, negative charge of BOOST decreases or positive charge increases.

Figure 8:
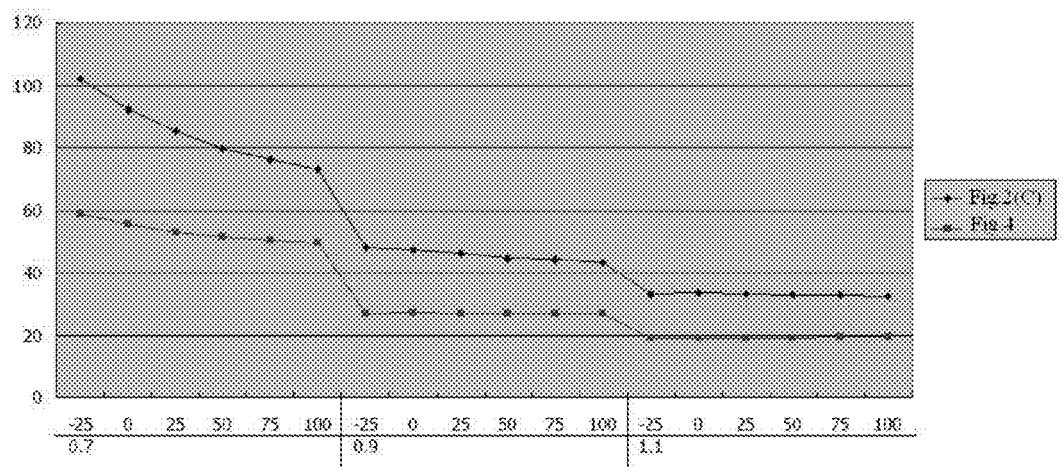
FIG. 8 is an experiment result diagram showing performance improvement in sense amplifier.

FIG. 8 is speed comparison of the sense amplifier shown in FIG. 2(C) and the sense amplifier shown in FIG. 4 under different temperatures and different power supply levels. Points of diamond indicate $\Delta t$ of the sense amplifier as shown in FIG. 2(C), while points of square indicate $\Delta t$ of the sense amplifier as shown in FIG. 4. The horizontal axis shows temperature and power supply level, wherein the power supply operation level is set to 0.7, 0.9, 1.1 volt respectively, and the temperature is set to −25, 0, 25, 50, 75, 100 Celsius degree respectively. The vertical axis is value of $\Delta t$ with unit of picosecond ($10^{-12}$). It can be seen from FIG. 8 that, the speeds of sense amplifier shown in FIG. 2(C) are all lower than speeds of sense amplifier shown in FIG. 4 under different combinations of temperature and operation level.

Figure 9:
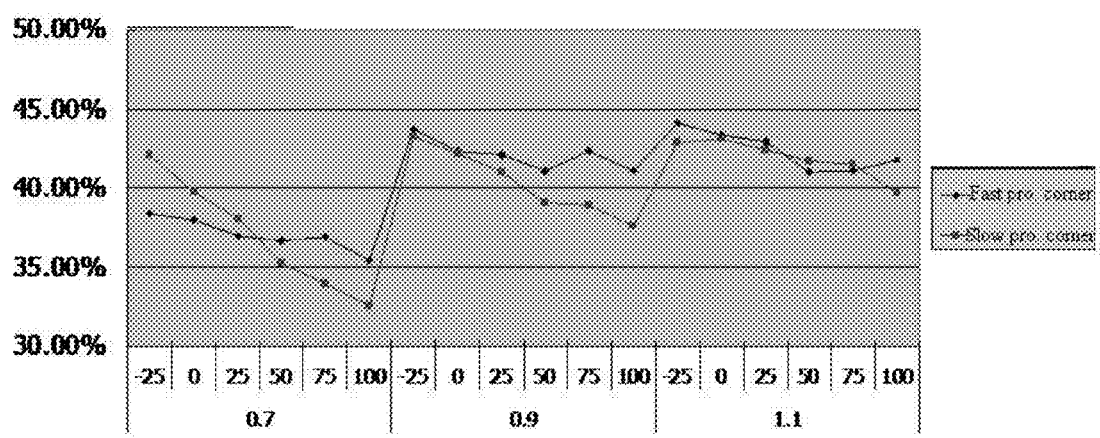
FIG. 9 is an experiment result diagram showing performance improvement in sense amplifier.

FIG. 9 shows speed enhancement of sense amplifier shown in FIG. 4 relative to the sense amplifier shown in FIG. 2(C). In FIG. 9, points of diamond indicate the case of fast process corner, and points of square indicate the case of slow process corner. It can be seen from FIG. 9 that, whether under the case of fast process corner or slow process corner, speed enhancement of sense amplifier shown in FIG. 4 relative to the sense amplifier shown in FIG. 2(C) is above 30%.

It can be seen from the above description that, speed of sense amplifier can be increased by connecting a negative level at the source of tail current transistor of the sense amplifier. The negative level may be implemented by setting a negative voltage supply source or may be implemented through a bootstrap circuit.

In particular, in the latter case, the bootstrap circuit may be arranged via various manners. For example, a bootstrap circuit may be set for each SRAM cell respectively, or a bootstrap circuit may be set for each sense amplifier respectively, or a shared bootstrap circuit may be set for multiple sense amplifiers.

Figure 10:
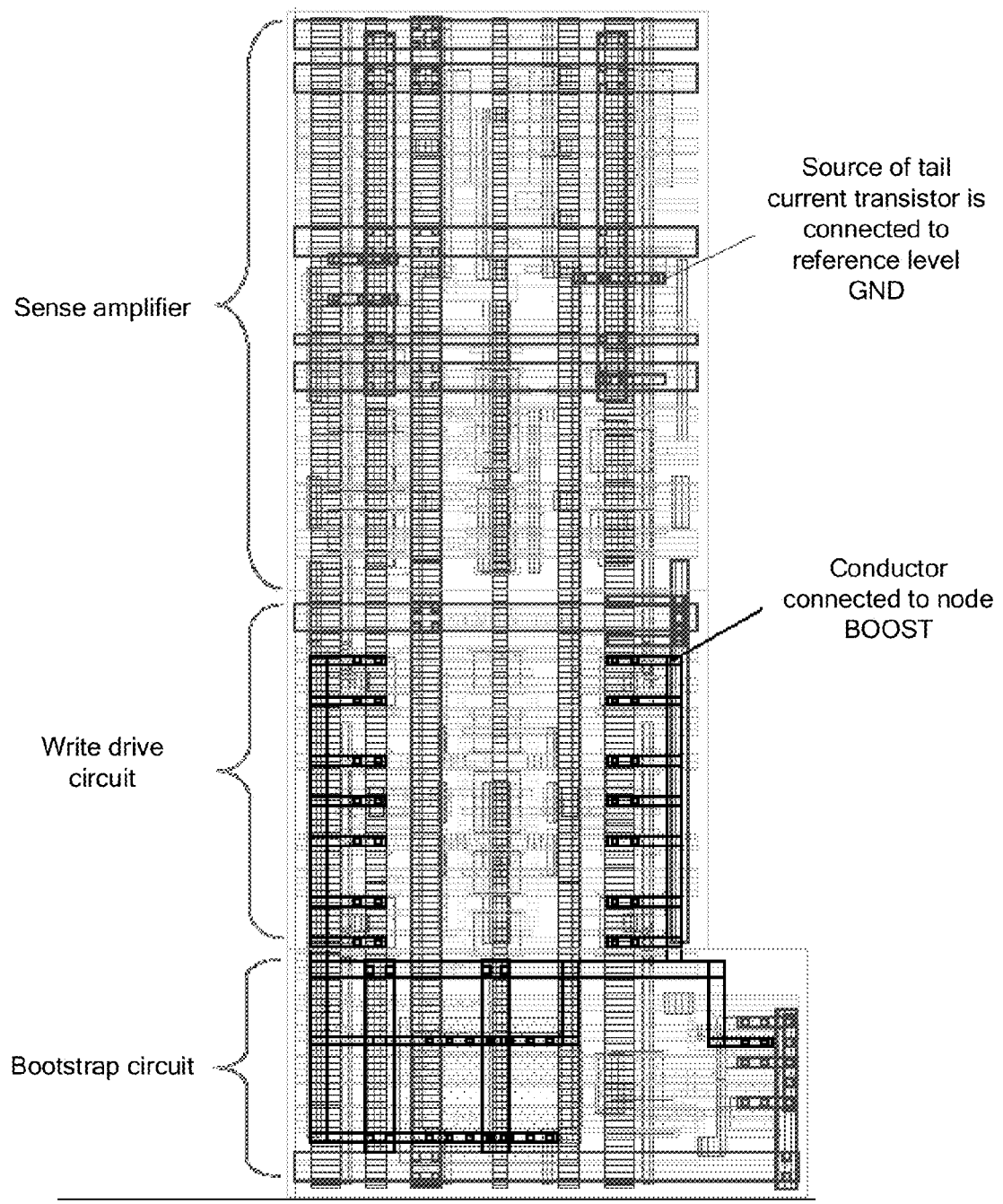
FIG. 10(A) and FIG. 10(B) are circuit layout diagrams.
Figure 10:
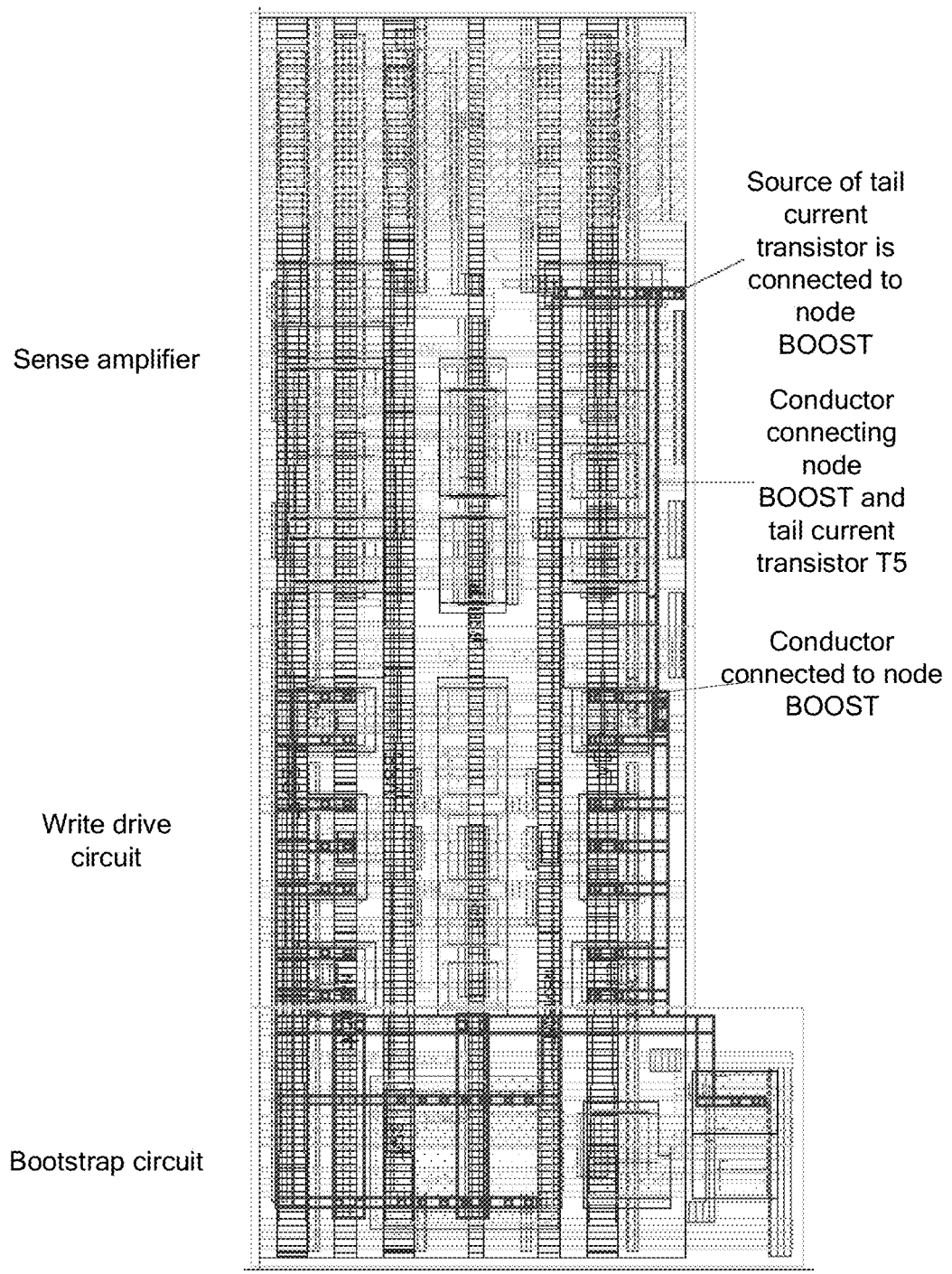

According to an embodiment of the invention, the sense amplifier may share a bootstrap circuit with a write drive circuit in a SRAM chip. In this case, the shared bootstrap circuit operates when read operation or write operation is performed on SRAM cell respectively. In the layout shown in FIG. 10(A) and FIG. 10(B), the sense amplifier, write drive circuit and bootstrap circuit are shown. In FIG. 10(A), the write drive circuit is connected to the bootstrap circuit; the source of tail current transistor T5 of the sense amplifier is connected to the reference level GND. In FIG. 10(B), the bootstrap circuit is further connected to the source of tail current transistor T5 of the sense amplifier. It can be seen from FIG. 10(B) that, no additional circuit overhead is incurred when the bootstrap circuit originally configured for the write drive circuit is re-used to supply negative level to the tail current transistor of the sense amplifier.

Those skilled in the art can appreciate that, in case that the sense amplifier and write drive circuit share a bootstrap circuit, the bootstrap circuit is enabled during read operation and write operation respectively. Since the read operation and write operation will not be conducted simultaneously, sharing of the bootstrap circuit will not lead to a conflict.

Figure 11:
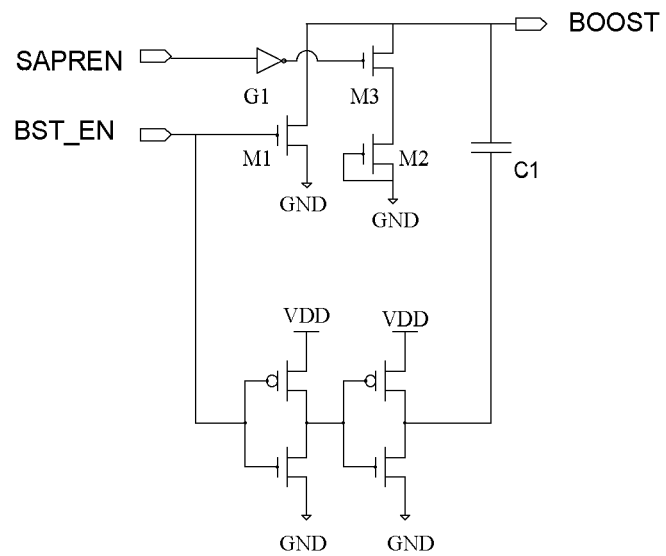
FIG. 11(A) and FIG. 11(B) are diagrams of bootstrap circuit.
Figure 11:
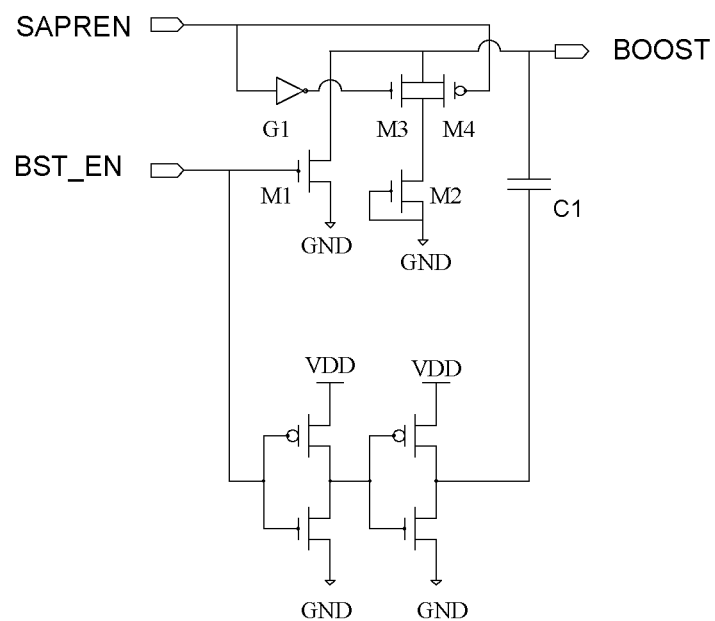

In particular, in case that the sense amplifier and write drive circuit share a bootstrap circuit, the bootstrap circuit according to an embodiment of the invention is as shown in FIG. 11(A) and FIG. 11(B). In FIG. 11(A) and FIG. 11(B), in comparison with the bootstrap circuit shown in FIG. 6, a clamper M2 connected between reference level GND and node BOOST is added. The clamper M2 is shown in FIG. 11(A) and FIG. 11(B) as a transistor, with connection manner equivalent to a reverse bias diode. The function of M2 is that it would be turned on when a potential difference by which level of BOOST node is lower than a reference level exceeds a threshold voltage, thereby keeping the potential difference equal to the threshold voltage. The performance of write drive circuit may be enhanced by adding M2 in the bootstrap circuit as shown in FIG. 6.

However, when using that bootstrap circuit to supply negative level to the source of tail current transistor of the sense amplifier, there is no need to clamp BOOST. Therefore, a clamper switch circuit is added in FIG. 11(A) and FIG. 11(B), so that clamper M2 will not be functional during operation of the sense amplifier. The clamper switch circuit is connected between clamper M2 and node BOOST, or it may be connected between clamper M2 and reference level GND.

In FIG. 11(A), the clamper switch circuit is implemented by N-type transistor M3 and controlled by reversed SAPREN signal. The source of M3 is connected to clamper M2, the drain is connected to node BOOST, and the gate is connected to output of NOT gate G1. As mentioned above, during operation of the sense amplifier, SAPREN signal is at logic high level, so that N-type transistor M3 is turned off; when the sense amplifier is not operating, SAPREN signal is at logic low level, so that N-type transistor M3 is turned on, thereby forming a path from BOOST to reference level GND passing through clamper M2. Those skilled in the art can appreciate that, SAPREN signal may also be replaced by SET signal or other signal, as long as it may disconnect the clamper switch circuit, so as to disable the clamper, when read operation is conducted on SRAM cell.

Those skilled in the art can appreciate that, due to corresponding relationship of transistor characteristic and transistor type, M3 may also be implemented by P-type transistor. In this case, SAPREN or SET signal is directly connected to gate of M3 without being reversed by NOT gate. However, if M3 is implemented by P-type transistor, a potential difference will occur between the source and drain of M3 when the bootstrap circuit is cooperating with write drive circuit, such that working effect of clamper M2 will be affected. Therefore, M3 will have better performance when being implemented with N-type transistor than using P-type transistor, taking into account that the bootstrap circuit is shared by the sense amplifier and write drive circuit.

In FIG. 11(B), the clamper switch circuit is composed of N-type transistor M3 and P-type transistor M4 connected in manner of a complementary pass-gate. The complementary pass-gate is that the source of M3 is connected to the drain of M4 and the drain of M3 is connected to the source of M4. The gate of N-type transistor is controlled by reversed SAPREN signal and P-type is controlled by SAPREN signal. As mentioned above, during operation of the sense amplifier, SAPREN signal is at logic high level, such that N-type transistor M3 and P-type transistor M4 are turned off; when the sense amplifier is not operating, SAPREN signal is at logic low level, so that N-type transistor M3 and P-type transistor M4 are turned on, thereby forming a path from BOOST to reference level GND passing through clamper M2.

Although various means and methods of the invention have been described in detail in conjunction with detailed embodiments, the invention is not limited thereto. Those skilled in the art can make various change, substitution and modification to the invention under teaching of the description without departing from the spirit and scope of the invention. It is appreciated that, all such change, substitution and modification still fall within protection scope of the invention defined by appended claims.

The invention claimed is:

1. A sense amplifier, comprising:
    a first transistor, a second transistor, a third transistor, a fourth transistor, a tail current transistor and an output stage:
    wherein, gate of the second transistor and gate of the fourth transistor are connected to two inputs of the sense amplifier respectively, gate of the third transistor, drains of the first transistor and the second transistor are connected at a second node, gate of the first transistor, drains of the third transistor and the fourth transistor are connected at a first node, sources of the first transistor and the third transistor are connected to an power supply level, sources of the second transistor and the fourth transistor are connected to drain of the tail current transistor, gate of the tail current transistor is connected to a sense amplifier enabling signal, source of the tail current transistor is connected to a negative level, and the first node and the second node are connected to the output stage respectively,
    wherein the negative level is supplied from a negative voltage output node of a bootstrap circuit.

2. The sense amplifier of claim 1, wherein the bootstrap circuit is further connected to a write drive circuit for conducting write operation on a SRAM cell.

3. The sense amplifier of claim 1, wherein the bootstrap circuit further comprises a clamper that is turned on when a potential difference by which level of the negative voltage output node is lower than a reference level exceeds a threshold voltage, thereby making the potential difference equal to the threshold voltage.

4. The sense amplifier of claim 3, further comprising a clamper switch circuit that disables the clamper during operation of the sense amplifier.

5. The sense amplifier of claim 4, wherein the clamper switch circuit is implemented by a N-type transistor.

6. The sense amplifier of claim 4, wherein the clamper switch circuit is implemented by a complementary pass-gate composed of a N-type transistor and a P-type transistor.

7. A method for conducting read operation on a SRAM cell, comprising:
    connecting a bit line of the SRAM cell to an input of a sense amplifier;
    enabling a bootstrap circuit connected to source of a tail current transistor of the sense amplifier, such that a negative voltage output node of the bootstrap circuit outputs a negative voltage to the source of the tail current transistor;
    enabling the sense amplifier, so as to read the logic value stored in the SRAM cell.

8. The method of claim 7, wherein the bootstrap circuit is further connected to a write drive circuit for conducting write operation on the SRAM cell.

* * * * *